United States Patent [19]
Chang

[11] Patent Number: 5,477,379
[45] Date of Patent: Dec. 19, 1995

[54] ELECTRICAL PULSE OPERATED LASER SAMPLING LIGHT AMPLIFIER

[75] Inventor: Sheldon S. L. Chang, Port Jefferson, N.Y.

[73] Assignee: The Research Foundation of State University of New York, Albany, N.Y.

[21] Appl. No.: 268,822

[22] Filed: Jun. 3, 1994

Related U.S. Application Data

[62] Division of Ser. No. 785,551, Oct. 31, 1991, Pat. No. 5,331,455.

[51] Int. Cl.⁶ ............................ H01L 31/12; H01L 15/00; H01S 3/20
[52] U.S. Cl. ............................ 359/344; 359/176; 359/345; 372/44
[58] Field of Search ............................ 359/176, 344, 359/345; 357/17; 372/44, 46, 81

[56] References Cited

U.S. PATENT DOCUMENTS

| | | |
|---|---|---|
| 4,484,144 | 11/1984 | Nakagome et al. . |
| 4,736,164 | 4/1988 | Henning . |
| 4,766,597 | 8/1988 | Olshansky . |
| 5,003,268 | 3/1991 | Tsuchiya . |
| 5,032,879 | 7/1991 | Buchmann et al. . |
| 5,142,408 | 8/1992 | Marshall et al. . |
| 5,331,455 | 7/1994 | Chang ............................ 359/344 |

OTHER PUBLICATIONS

Hansen, et al., "Picosecond Pulse Amplification By Electrically Pulsed Semiconductor Optical Amplifiers", *Electronics Letters*, 25, No. 9, Apr. 27, 1989.

Van der Ziel, et al., "High Power Picosecond Pulse Generation in GaAs Multiquantum Well Phase-Locked Laser Arrays Using Pulsed Current Injection," *IEEE Journal of Quantum Electronics*, QE-20 (No. 11), Nov. 1984, pp. 1236–1242.

Olesen, et al., "Subnanosecond Switching in Bistable Fabry–Perot Semiconductor Laser," Opt. Fiber Commun. Conf., OFC 9, IEEE cat. No. 90 Ch 2821–7, p. 117.

Chang, "Pulsed Laser Sampling Photon Amplifier," *IEEE Photonics Technology Letters*, 3, No. 11, Nov. 1991, pp. 988–989.

Johnson, et al., "Transient Carrier Density and Light Output Measurements of Pulsed Diode Lasers," IEEE Service Center, cat. No. 85 Ch 2174–1, pp. 158–159.

*Primary Examiner*—Mark Hellner
*Attorney, Agent, or Firm*—Hoffmann & Baron

[57] ABSTRACT

A sub-nanosecond pulse operated semiconductor laser amplifier which admits light input for a time interval after the commencement of the electrical pulse. The duration of the said time interval is shorter than that of the said electrical pulse. Amplified light output reaches a peak value after the termination of the said electrical pulse. The pulsed operation can be repeated a few billion times per second. Applications in a fiber-optics communication system, a bar code scanner, and in a super speed camera are described.

6 Claims, 9 Drawing Sheets

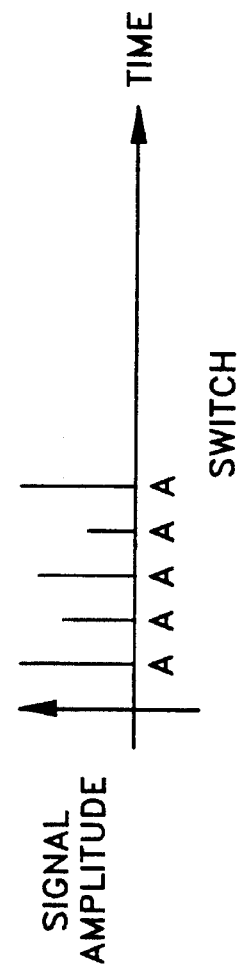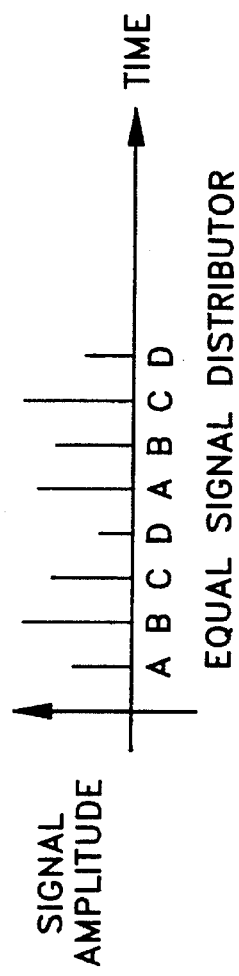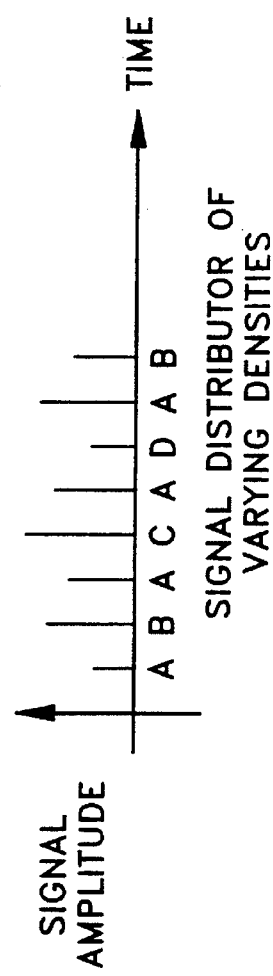

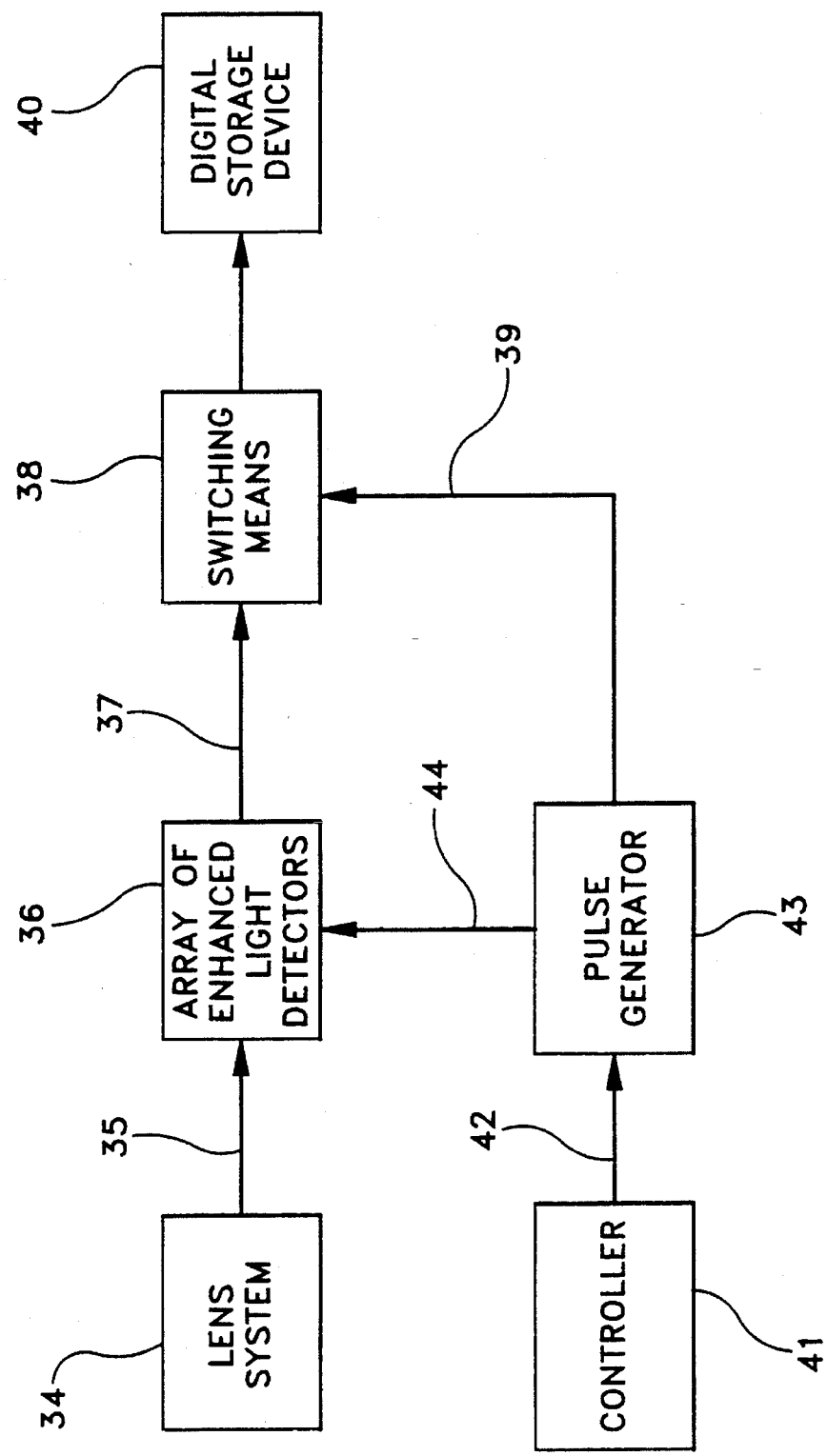

ELECTRICAL PULSE OPERATED LASER SAMPLING LIGHT AMPLIFIER

This is a divisional application of application Ser. No. 07/785,551 filed on Oct. 31, 1991 now U.S. Pat. No. 5,331,455.

BACKGROUND OF THE INVENTION

1. Field of the Invention

The present invention relates to semiconductor laser amplifiers which can be used as a repeater or an amplifying distributor on-line switch in a time-division multiplexing optical fiber communication system. Other applications include bar code scanners and a super speed video camera which can take billions of pictures per second with a shutter speed of approximately $10^{-11}$ second.

2. Description of Prior Art

Presently there are two types of semiconductor laser light amplifiers: (i) the traveling wave amplifier (TWA) and (ii) the resonant type or Fabry Perot amplifier (FPA). In both types, direct currents are used to inject minority carriers into the active channel for lasing action. The essential difference between the two types is the reflectivities at the ends of the active channel.

In a TWA, the reflectivities are made as small as possible. Considerable amount of research work is still being performed with respect to reducing reflectivities. The input light wave is amplified as it travels from one end of the active channel to the other end. The reflected waves are also amplified. If the product of the reflectivities and the round trip gain exceeds 1, the "amplifier" would emit light without any light input creating a useless amplifier. If the product is a significant fraction of 1, an interference pattern would develop between the main wave and the reflected waves. The interference pattern is "noise" and is a severe limiting factor on the gain of a TWA.

In an FPA, the reflectivities are usually on the order of a few tenths. Thus, light photons are partially trapped between the two reflecting ends, and their number multiplies due to stimulated emission as the photons travel back and forth in the active channel. The amplification factor increases exponentially with the densities of the minority carriers in the active channel. At a certain density level, the product of the reflectivities and the round trip amplification factor is equal to 1, and the "certain density level" is then referred to in the technical literature as the critical density which is denoted here as $N_c$. It should be noted that the operating minority carrier density level in a TWA can be considerably higher than the critical density of an FPA made with the same material because the reflectivities of the TWA are much lower.

Operating at its critical density, the total loss of photons in an FPA, including photon losses at its two ends, is substantially equal to the number of newly generated photons due to stimulated emission. If the device is left alone without further light input, the number of photons travelling back and forth in its active channel would remain constant, with a constant output at the output facet. The device would not be useful as a light amplifier because it would provide an output without any input.

However, if an FPA is operated at a carrier density level N slightly below critical, ($N<N_c$, $N_c-N<<1$), and a light signal is applied to its input, the photon density in the active channel would build up gradually, until the net photon loss is equal to the number of input photons. The following would happen as N approaches $N_c$:

(i) the amplifier gain increases;

(ii) the buildup time, or response time increases; and (iii) the amplifier bandwidth narrows.

There is a limit as to how close N can be made to approach $N_c$. Because each stimulated emission means the loss of one minority carrier, with the same injection dc current, N reduces as the light input increases. The effect of gain reduction with input light intensity is called "gain compression" and is common to all laser light amplifiers However, the gain reduction is far more severe in an FPA because its gain depends on $1/(N_c-N)$ rather than on N itself.

The present invention provides a higher performance than both the TWA and the FPA because it does not require the following limiting conditions of operation:

(i) vanishingly small reflectivities at the two end facets; and (ii) an operating minority carrier density less than the critical density but approaching the critical density.

In addition, the signal sampling effect which is characteristic of the present invention is important to the applications mentioned in paragraph 1, Field of the Invention.

OBJECTS AND SUMMARY OF THE INVENTION

It is an object of the present invention to provide a pulse operated semiconductor laser light amplifier which does not require extremely small reflectivities at the two end facets.

It is another object of the present invention to provide a pulse operated semiconductor laser light amplifier which is not restricted by an operating minority carrier density less than the critical density.

It is an object of the present invention to provide a pulsed FPA having a higher signal to noise ratio and higher gain as compared to the present semiconductor laser amplifiers.

It is yet a further object of the present invention to provide a pulse operated semiconductor laser amplifier which admits light input for a time interval after the commencement of the electric pulse thereby producing a signal sampling effect on the input light signal.

In accordance with the present invention, a pulsed laser sampling light amplifier includes a buried heterostructure semiconductor laser with a resonant cavity which is adapted to be connected to a source of electric current pulses. The current pulses are applied to the semiconductor laser which creates minority carriers within the resonant cavity.

The current source should create pulses of sufficient magnitude and duration to allow the minority carrier density to momentarily rise above its critical density after the pulse is terminated. Also, the current pulses should be sufficiently separated to allow the minority carriers to decay significantly below its critical density before the next current pulse is applied.

As a result of the present invention, a pulse operated semiconductor laser has a signal sampling speed in the order of 0.02 nanoseconds. The signal sampling effect makes the amplifier less sensitive to reflected signals outside the sampling period as well as reducing signal noise by operating only during the sampling period.

The pulse operated semiconductor laser has reflectivities of both end facets of the active channel which exceed 0.1. The present invention provides both higher gain and signal to noise ratio.

A preferred form of the pulse operated laser sampling light amplifier, as well as other embodiments, objects, features and advantages of this invention, will be apparent from the following detailed description of illustrative embodiments thereof, which is to be read in connection with the accompanying drawings.

BRIEF DESCRIPTION OF THE DRAWINGS

FIG. 7a–c are plots illustrating the variety of operations which can be performed by a plurality of controlled pulse operated laser sampling light amplifiers in an optical communication system, in accordance with the present invention.

FIG. 9 is a block diagram of a super speed video camera (SSVC) formed in accordance with the present invention.

DESCRIPTION OF THE PREFERRED EMBODIMENT

Figure 1:
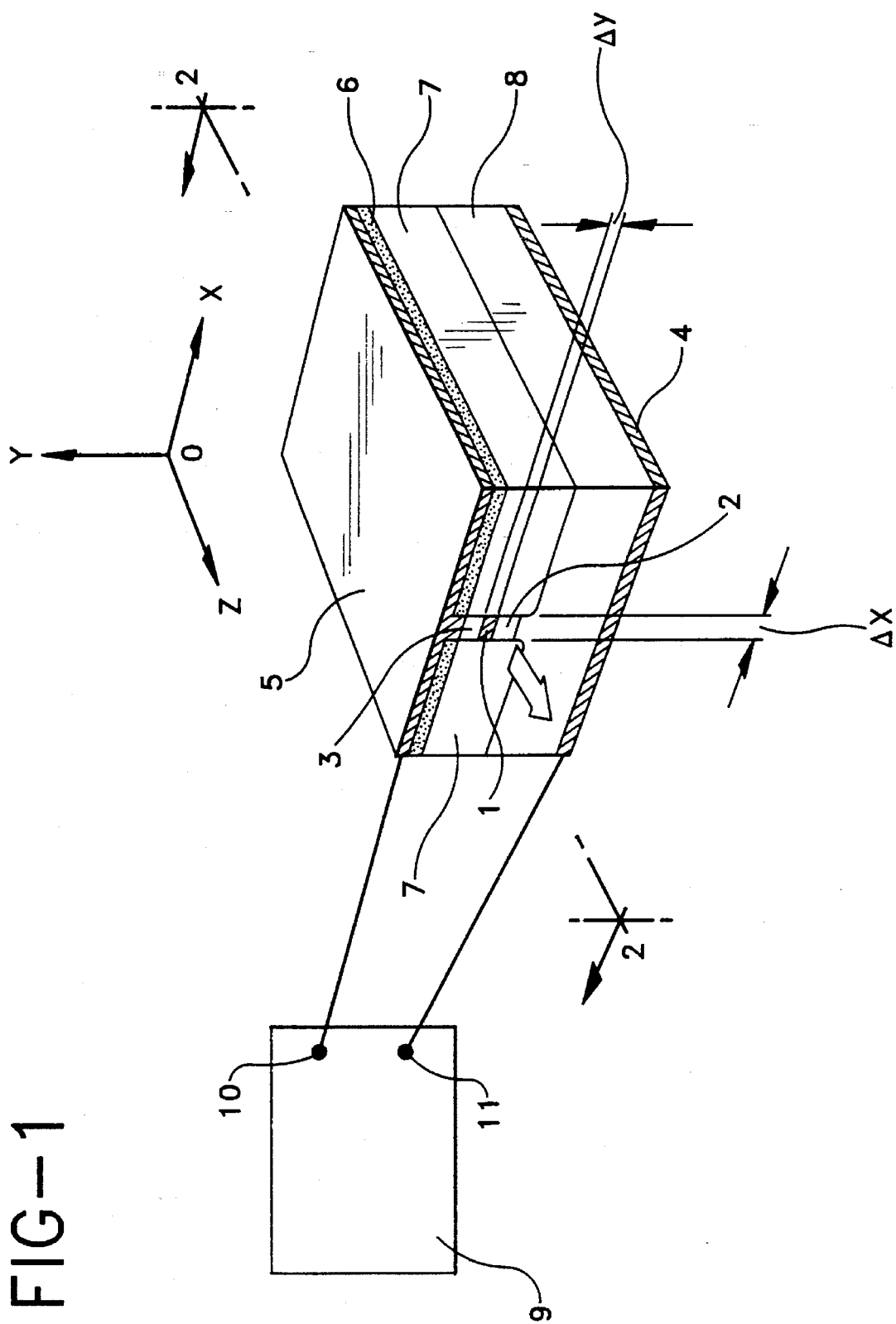
FIG. 1 is a perspective view of an electrical pulse operated laser sampling light amplifier consisting of a buried heterostructure laser and connected to an electric circuit to supply a current pulse or waveform.

FIG. 1 illustrates a preferred embodiment of the invention. On the right hand side is an illustration of a buried heterostructure (BH) laser amplifier. The laser amplifier includes a thin GaAs slab 1 with typical dimensions $\Delta x=3\mu m$, $\Delta y=0.1\mu m$, and $\Delta z=100\mu m$. The slab 1 is embedded in $Ga_{1-x}Al_x As$ on all four sides. Since $Ga_{1-x}Al_x As$ has a lower index of refraction and larger energy gap, the slab 1 becomes an optical waveguide as well as an active lasing channel (also referred to herein as a resonant cavity) provided sufficient minority carriers are injected into it ($N>N_c$). Referring to FIG. 1, reference numeral 2 denotes a negative terminal made of $n-Ga_{1-x}Al_x As$ material. Reference numeral 3 denotes a positive terminal made of $p-Ga_{1-x}Al_x As$ material. Numerals 4 and 5 refer to the negative and positive contacts respectively. Reference numeral 6 represents an oxide insulation layer. Numeral 7 denotes a $n-Ga_{1-x}Al_x As$ burying layer, and numeral 8 refers to a n-GaAs substrate. The slab 1 is sandwiched between the positive terminal 3 on the top of the slab, the negative terminal 2 on the bottom of the slab, and on both sides by the burying layer 7. Below the burying layer is a layer of n-GaAs substrate 8 and below that is the negative contact 4. On top of the burying layer 7 is an oxide insulation layer 6 and on top of that is the positive contact 5. On the left side of FIG. 1, reference numeral 9 represents an electrical circuit which supplies a current pulse of specified waveform and duration to the laser amplifier. The circuit includes a positive terminal 10 and a negative terminal 11. In the preferred arrangement, pulse source 9 can be a separate unit, or part of an optico-electronic integrated circuit included within the laser assembly on the right side of FIG. 1.

Figure 2:
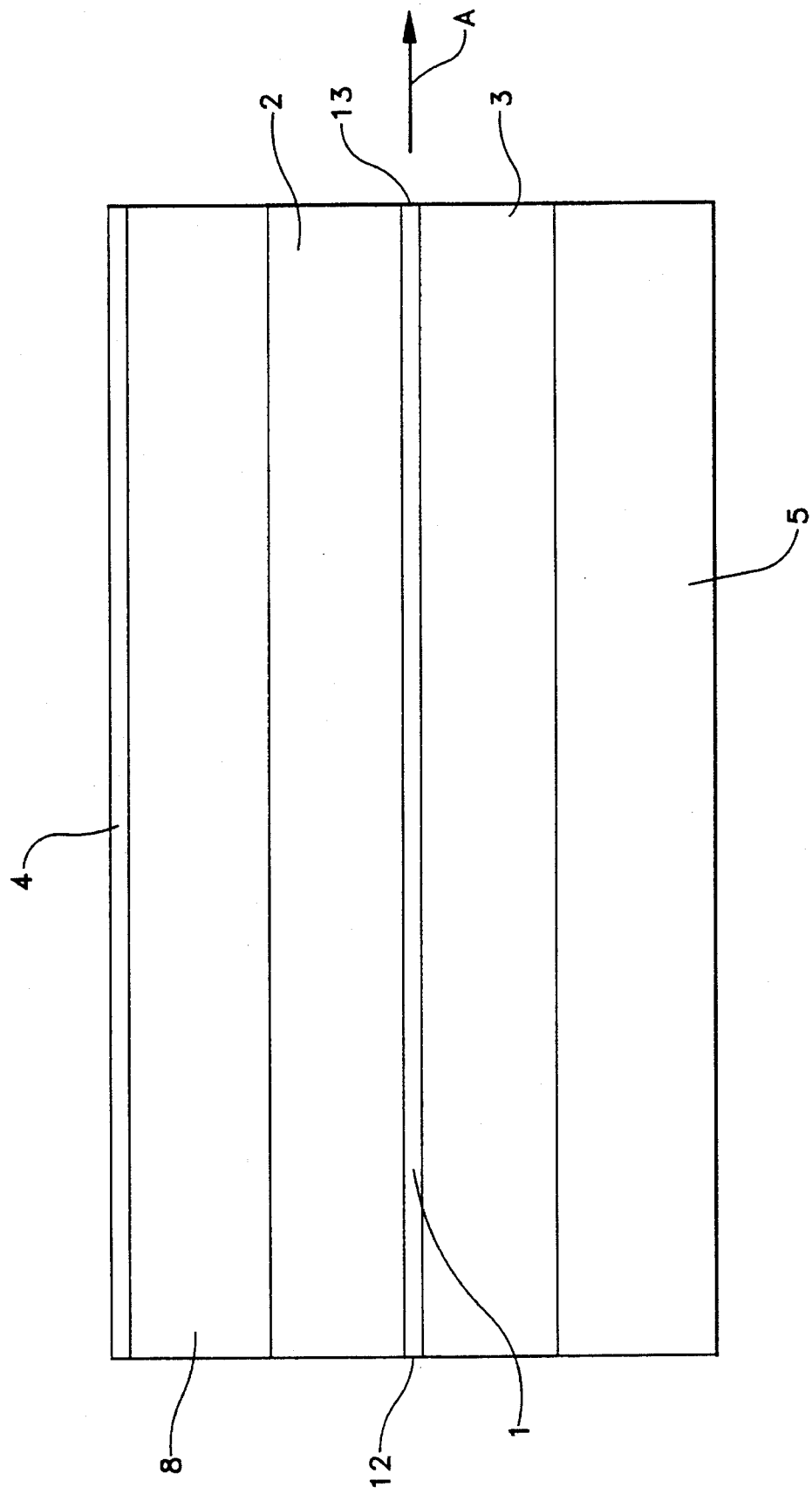
FIG. 2 is a vertical cross-section view of the buried heterostructure laser amplifier taken along line 2—2.

FIG. 2 is a vertical cross-section cut through the center of laser amplifier 1. The laser amplifier is shown in FIG. 2 as including end facets 12, 13 situated at the opposite axial ends of slab 1. Light input is through the end facet 12 of the active channel 1, and light output is through the end facet 13. Arrow A in FIG. 2 indicates the direction of light output. In the preferred embodiment, both the reflectivities at 12 and 13 are at least 0.1 or above. Thus, the present invention can be described as a pulse operated FPA, or, PFPA.

Figure 3:
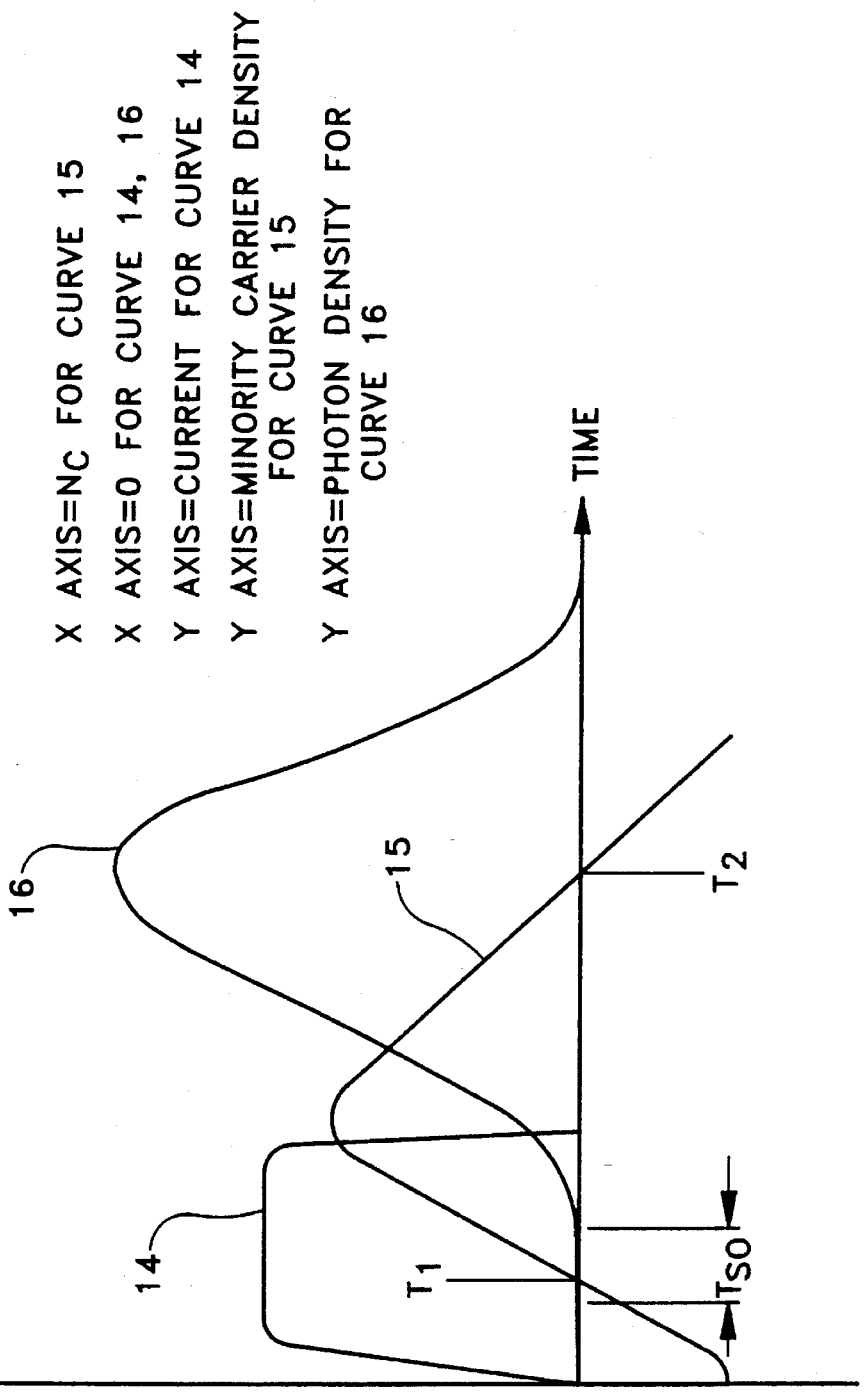
FIG. 3 is a plot illustrating the relationship between a single current pulse and the minority carrier density and photon density as a function of time.

FIG. 3 illustrates the changes in minority carrier density (represented by curve 15) and photon density (represented by curve 16) after a current pulse (represented by curve 14) is applied. Initially the minority carrier density is very much below its critical level: $N-N_c<0$. Any input light wave is attenuated. With the application of a current pulse, N rises from a level below $N_c$ to a level above $N_c$ and rises to a peak approximately at the time the current pulse terminates. After the current pulse terminates, N decays essentially exponentially towards zero and is accelerated in its decay by stimulated emission. The number of coherent or signal photons in the active channel 1 rises exponentially at a rate proportional to $N-N_c$ and reaches a peak at $T_2$ when $N=N_c$. Shortly after $T_1$, the coherent photon density in the active channel 1 is so large compared to the photon input that the latter becomes insignificant. Thus, there is a short interval in which the pulsed amplifier is most sensitive to input. This short interval is denoted as $T_{so}$ in FIG. 3. Since the output light intensity is proportional to the photon density in the active channel 1, the gain of the amplifier can be expressed as $$G_a = K_a \exp\left\{ \Gamma A \int_{T1}^{T2} v_g[N(t)-N_c]dt \right\} \quad (1)$$

where $K_a$ is a constant representing the trapping effect in a pulse operated FPA, $\Gamma$ is the optical mode confinement factor, A is the gain constant for accumulated emissions, $v_g$ is the velocity of light inside the active channel and N is the minority carrier density.

In a traveling wave amplifier (TWA), an input light signal passes straight through the active region. In contrast, the input light signal in the pulse operated FPA of the present invention is trapped between the two reflecting surfaces. The signal accumulates as it is being amplified. The constant $K_a$ represents the signal trapping and accumulating effect. The constant $K_a$ significantly multiplies the overall gain of the amplifier.

The PFPA of the present invention operates at an minority carrier density substantially above critical. It does not require a closely kept sub-critical minority carrier density, and consequently it does not have the same disadvantages of an FPA. The reflectivities at both end facets of the PFPA of the present invention are integral parts of its operation. The PFPA does not need nearly zero reflectivities, and consequently, its gain is not limited by such considerations. However, noise due to spontaneous emission may impose a limitation on gain.

Figure 4:
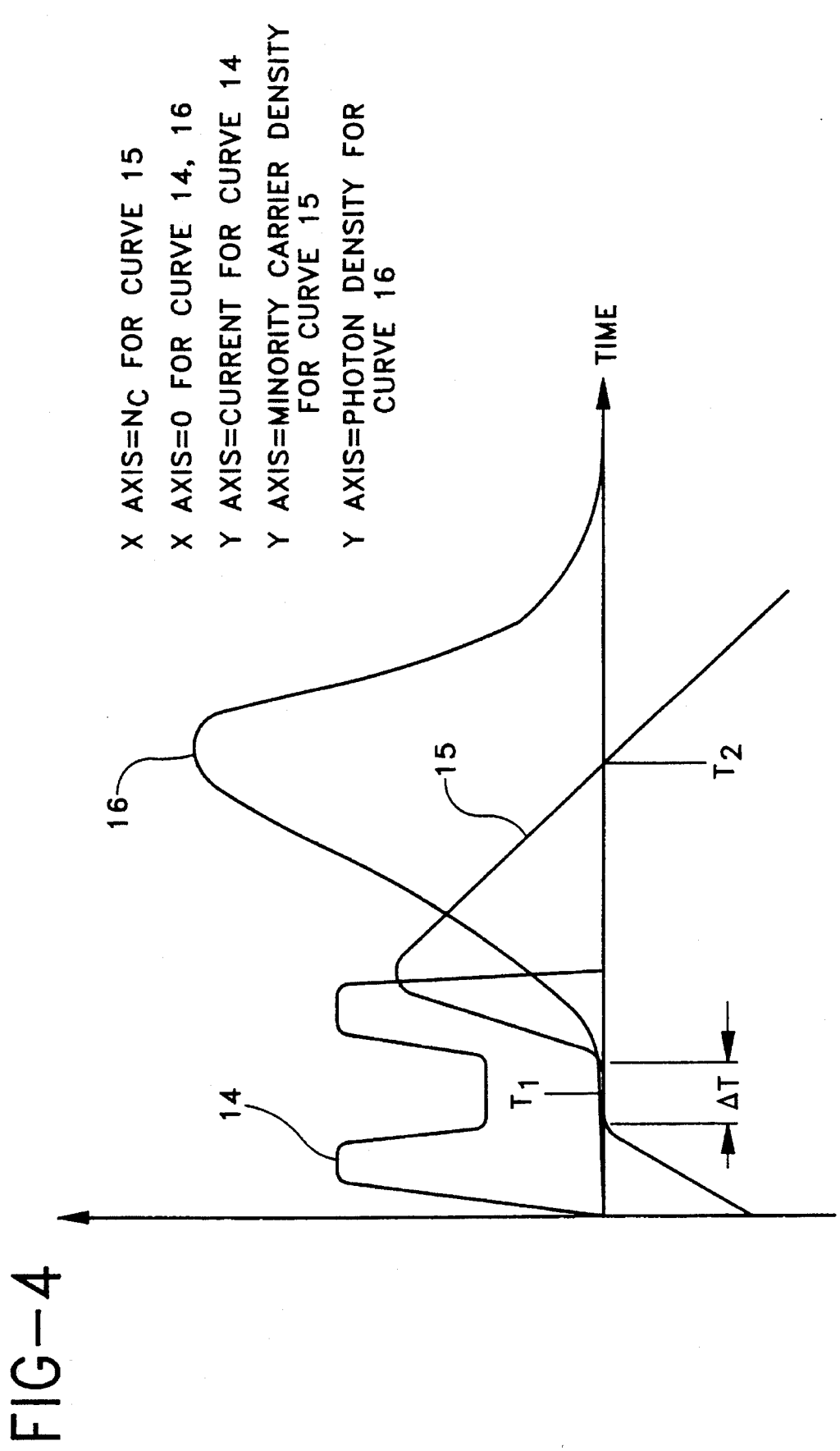
FIG. 4 is a plot illustrating the relationship between a dual peak current pulse and the minority carrier density and photon density as a function of time.

In accordance with the present invention, a method for increasing the signal to noise ratio in the amplifier is illustrated in FIG. 4. The first peak of the pulse increases the minority carrier density up to its critical value $N_c$. The magnitude of the current pulse between the two peaks is preferably such that the number of minority carriers is maintained at the critical level $N_c$ during the period between the peaks. The second peak increases the minority carrier density above the critical level $N_c$. The electrical current pulse waveform 14 is generated with two peaks separated in time. Consequently, there is a period $\Delta T$ (generally between the peaks) in which $N=N_c$ as shown in FIG. 4. Both the input signal photons and noise photons due to spontaneous emission are accumulated during the period $\Delta T$. Since the signal photons are accumulated coherently and the noise photons are accumulated incoherently, there is a substantial gain in the signal over noise ratio.

When the pulsed laser light amplifier of the present invention is to receive light input directly from air or empty space, the amplifier may include a matching funnel section 17 of approximately the same index of refraction as active channel 1 which greatly increases the amplification factor and signal to noise ratio.

Figure 5:
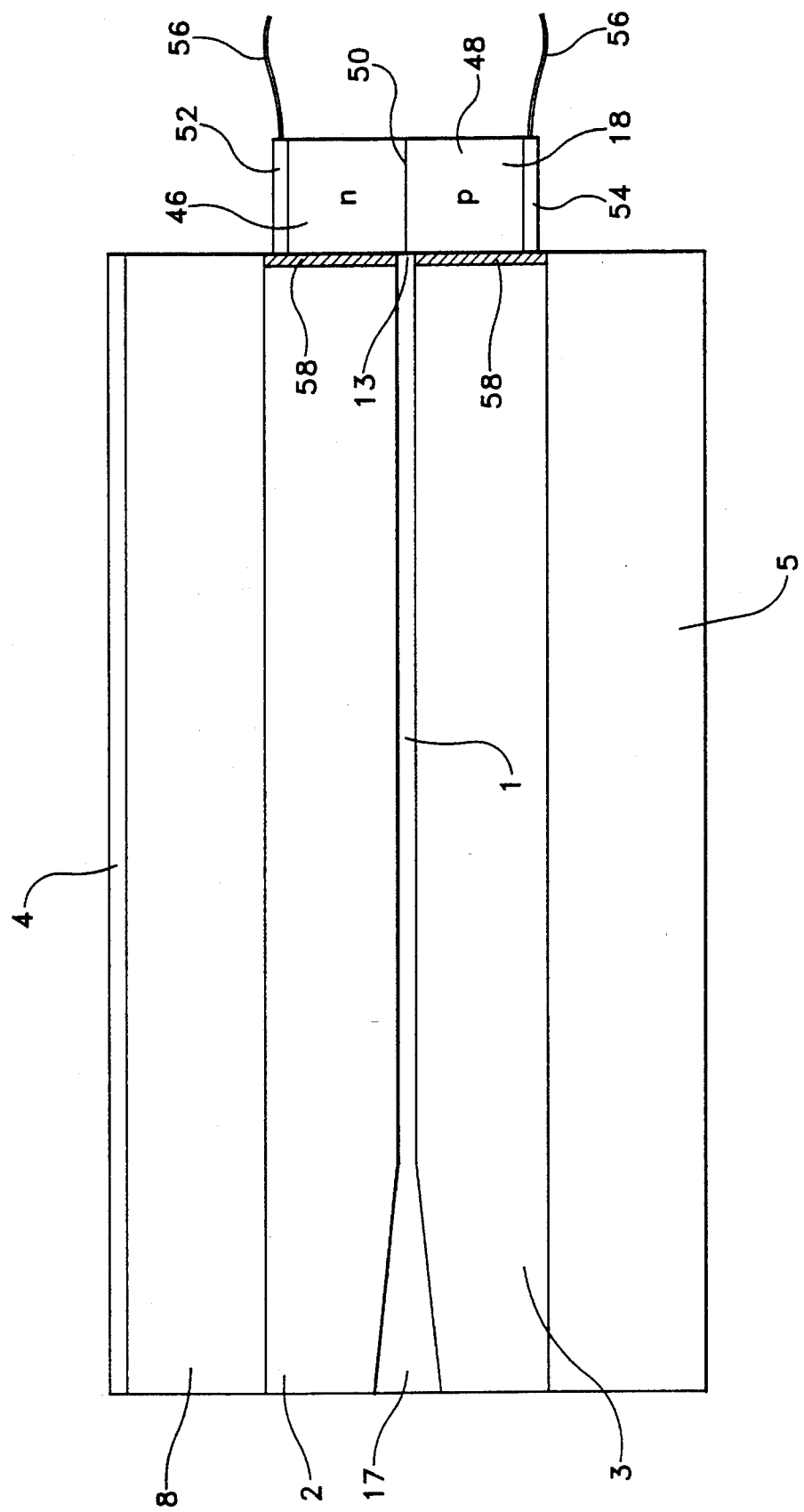
FIG. 5 is a vertical cross-section view of the buried heterostructure laser amplifier modified to receive light input from air or empty space and including a light detecting diode.

The laser amplifier of the present invention may further include a light detection diode 18 having adjacent n-type and p-type semiconductor sections 46 and 48, respectively, as shown in FIG. 5. The diode 18 is mounted adjacent to the output facet 13 such that the junction 50 of the n-type and p-type sections 46, 48 is axially aligned with the output facet 13 and the resonant cavity 1. An oxide insulation layer 58 is interposed between the diode 18 and the positive and negative terminals 3, 2 of the laser amplifier to insulate the diode from the amplifier. The diode 18 further includes positive and negative contacts 52, 54 respectively coupled to the p-type and n-type sections 48, 46. Electrical wires 56 are connected to contacts 52, 54. The input light from the active channel enters the junction 50 of the n-type and p-type semiconductor sections 46, 48 of the light detecting diode 18. The light detecting diode converts the light energy into an electrical output which may be digitally processed. By pulsing the structure shown in FIG. 5 with electrical current pulses, as described in relation to the embodiment of the pulsed light amplifier shown in FIG. 1, an enhanced light detector may be realized.

Figure 6:
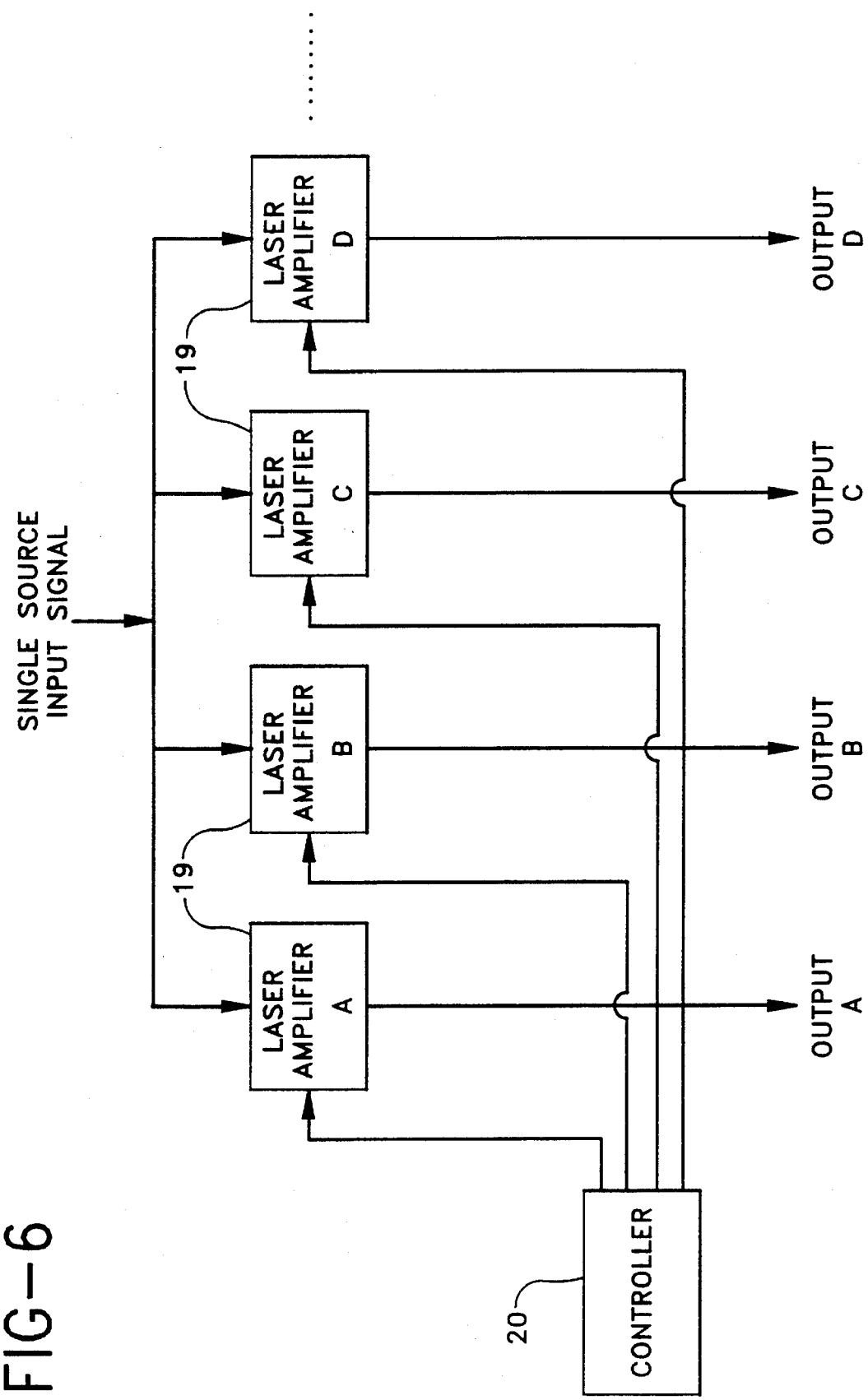
FIG. 6 is an illustrative block diagram of a communication system formed in accordance with the present invention and having a single source of input light pulses being supplied to a plurality of controlled pulse operated laser sampling light amplifiers.

FIG. 6 is a block diagram of a communication system formed in accordance with the present invention utilizing a plurality of pulse operated laser light amplifiers 19 operated by a controller 20, and FIG. 7 illustrates that input light pulses may be distributed in a variety of methods by such a system. Through the use of control signals from the controller 20 to each laser amplifier 19, the system of laser amplifiers can be used as a switch or as a distributor, as will be explained in greater detail.

Figure 8:
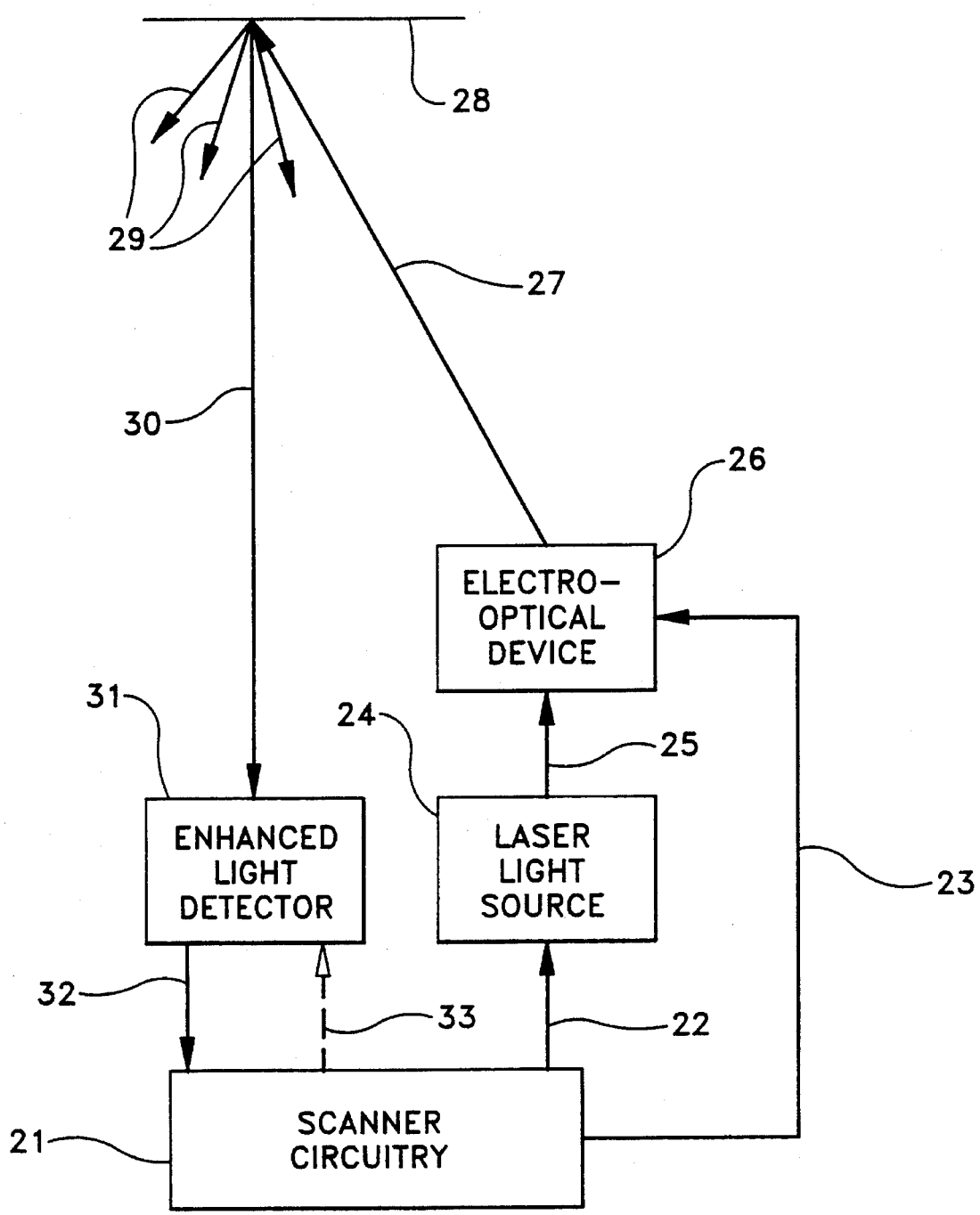
FIG. 8 is an illustrative block diagram of a bar code scanner formed in accordance with the present invention.

FIG. 8 is a block diagram of a bar code scanner and FIG. 9 is a block diagram of a super speed video camera, both of which will be explained in greater detail in the following examples.

The following examples serve to provide further appreciation of the invention but are not meant in any way to restrict the effective scope of the invention.

EXAMPLE 1

Application of pulse operated sampling laser light amplifier to a bar code scanner.

Referring to FIG. 8, the improved bar code scanner replaces the presently used light detector with an enhanced light detector 31, such as the one shown in FIG. 5. The scanner electronic circuitry 21 energizes the laser light source 24 with a pulse current signal (shown as being provided to light source 24 by line 22). The laser light source 24 produces a light beam 25, which is focused by an electro-optical device 26. The electro-optical device 26 is controlled by a signal 23 from the scanner electronic circuitry 21. A scanning beam 27 is generated by electro-optical device 26 and is scattered, as shown by lines 29, by the bar coded surface 28. A portion 30 of the light beam reflected by the bar coded surface enters the input of the enhanced light detector 31. The input light is amplified and converted to an electric current signal which is provided (as illustrated by line 32) to the scanner electronic circuit 21 for processing. The scanner electronic circuitry 21 also provides electric current signal pulses to the enhanced light detector 31, as described previously in relation to the embodiment shown in FIG. 5. The electric current pulses provided to the enhanced light detector 31 and the pulses of the current signal provided by the scanner circuit to the laser light source 24 are preferably synchronized.

Except for prefiltering, the electrical pulses from the photo cell or diode 18 are processed digitally. The digital processing includes:

a) determining bar and space widths directly from pulse counts;

b) coordinating adjacent lines for a better determination of bar and space widths;

c) algorithms for various corrections such as wide angle or warped symbols; and d) symbol identification.

The advantages of such a scanner include low cost, high performance and long life for the laser light source. The scanner is low cost since there is little analog electronics. All processing and control is performed digitally with software.

The performance of the scanner is enhanced due to the large gain of the pulsed laser sampling amplifier of the present invention used in the scanner, which makes it possible to work with a very weak reflected beam. Because the laser light source is driven by a pulsed signal and thus may be operated at a very low duty cycle, its life is extended.

EXAMPLE 2

Super speed video camera (SSVC)

The video camera employing the laser amplifier of the present invention would have a shutter speed of approximately 0.02 nanoseconds ($2 \times 10^{-11}$ sec.). The camera can take as many as five billion ($5 \times 10^9$) pictures per second.

Referring to FIG. 9, the SSVC contains a lens system 4 which focuses a picture (shown by line 35) prior to the picture 35 entering an array of enhanced light detectors 6 located at the focal plane of the camera. The array of enhanced light detectors 36 consists of a plurality of arranged enhanced light detectors 31, the enhanced light detectors operating as described previously in relation to the embodiment shown in FIG. 5. A controller 41 is coupled to and activates a pulse generator 43 with a control signal (shown by line 42). The pulse generator 43 is coupled to and supplies electric current pulses to each of the enhanced light detectors 31 of the array 36 and also to a switching means 38 (such signals shown by lines 39 and 44 respectively). The electric current pulses provided to the enhanced light detector array 36 and the switching means 38 are preferably synchronized. The switching means 38 is operatively interposed between and coupled with the array of enhanced light detectors 36 and a digital storage device 40 and is activated by control signals from the controller 41 to the pulse generator 43. The switching means 38 transfers the output electric current generated by each of the enhanced light detectors 31 (shown by line 37), such current being generated by the enhanced light detectors 31 in a similar manner to the electric current generated by the enhanced light detectors 31 as described for use in a bar code scanner in Example 1, to the digital storage device 40 for processing.

The key element in the SSVC is the pulsed laser sampling amplifier of the present invention. With a pulse-operated InGaAsP laser amplifier, the sampling time can be as short as 0.02 nanoseconds with a sampling period (or time interval between current pulses) of 0.2 nanoseconds. The InGaAsP laser amplifiers will be arranged as the input elements in an integrated optico-electronics array 36, and placed at the focal plane of the camera. The "shutter action" is not a mechanical shutter, but is provided by applying a forward current pulse (shown by line 44) to the laser amplifier array 36. The shutter time is much shorter than the pulse duration. The "shutter" opens at the time when the injected electron density increases above a critical density for lasing.

The video information is stored in arrays of fast memory 40. While the photon and electron recovering times impose an absolute limit of no more than about $5 \times 10^9$ pictures per second, two practical limitations may exist. They are:

(i) the time required for moving and/or processing data; and (ii) heat dissipation.

The camera is highly sensitive. Each laser amplifier has a gain of approximately 1000 or above, the gain being limited only by the noise due to spontaneous emission.

EXAMPLE 3

Application of a Pulse Operated Laser to an Optical Fiber Communications System.

FIG. 6 is an illustrative example of an optical communication system formed in accordance with the present invention, with a single source of input light pulses being supplied to a plurality of pulse operated laser sampling light amplifiers 19. The pulse operated laser amplifiers 19 are controlled by signals sent from a controller 20. In one embodiment of the invention, the control signals from controller 20 are provided to the current pulse generator means 9 of each sampling or pulsed light amplifier 19 to control the timing of the electric current pulses generated by the pulse generator means. Alternatively, one or more current pulse generators 9 may be included in controller 20 to provide electric current pulses to a plurality of BH laser amplifier structures, such as that shown in FIG. 1.

Three possible operations of this type of system are illustrated by FIG. 7. In the first system, illustrated by FIG. 7a, the pulse operated laser amplifiers 19 are being used as signal switches. The controller 20 activates only the amplifier associated with output of laser amplifier A. All incoming signals are permitted to pass through amplifier A and none will be permitted to pass through amplifiers B, C, or D.

FIG. 7b depicts a signal distributor in which the laser amplifiers 19 are pulsed in sequence. For example, the controller 20 allows the 1st, 5th, 9th, . . . pulses to pass through amplifier A; the 2nd, 6th, 10, . . . pulses to pass through amplifier B, and so on. Each amplifier 19 receives an equal number of signals equally spaced in time.

FIG. 7c depicts a signal distributor of varying densities. More signal pulses are permitted to pass through amplifier A than the other amplifiers, creating a larger signal density to the output of amplifier A.

While there have been described what are presently believed to be the preferred embodiments of the invention, those skilled in the art will realize that changes and modifications may be made thereto without departing from the spirit of the invention, and it is intended to claim all such changes and modifications as fall within the true scope of the invention.

What is claimed is:

1. A bar code scanner, which comprises:

an enhanced light detector; including a semiconductor laser light amplifier having an input end and an output end and means defining a resonant cavity situated between and coupled to the input end and the output end;

means for generating electric current pulses, the current pulse generating means being coupled to the laser light amplifier to apply electric current pulses to the light amplifier to inject minority carriers into the resonant cavity thereof;

the electric current pulses generated by the pulse generating means being of sufficient magnitude and duration to raise the number of the minority carriers above a critical level temporarily after the application of each of the current pulses, the current pulses being sufficiently separated in time for the minority carriers to decay below the critical level after the termination of each of the current pulses, said critical level of minority carriers being defined as the minimum number of minority carriers above which an intensity of light in the resonant cavity would rise exponentially with time even without further light input; and a pulsed laser light source, the pulsed laser light source emitting pulses of laser light, which pulses are detected by the enhanced light detector, the pulsed laser light source and the enhanced light detector being operatively synchronized.

2. A bar code scanner as defined by claim 1, wherein the pulsed laser sampling light amplifier includes a funnel shaped section situated at the input end thereof and coupled to the resonant cavity.

3. A super speed video camera, which comprises:

an array of enhanced light detectors each enhanced light detector including a semiconductor laser light amplifier having an input end and an output end and means defining a resonant cavity situated between and coupled to the input end and the output end;

means for generating electric current pulses, the current pulse generating means being coupled to the laser light amplifier to apply electric current pulses to the light amplifier to inject minority carriers into the resonant cavity thereof;

the electric current pulses generated by the pulse generating means being of sufficient magnitude and duration to raise the number of the minority carriers above a critical level temporarily after the application of each of the current pulses, the current pulses being sufficiently separated in time for the minority carriers to decay below the critical level after the termination of each of the current pulses, said critical level of minority carriers being defined as the minimum number of minority carriers above which an intensity of light in the resonant cavity would rise exponentially with time even without further light input;

a diode light detector situated adjacent to the output end of the pulsed laser light amplifier, the diode light detector receiving a light output emitted by the laser sampling light amplifier and converting the light output into electric current; and means for supplying electric current pulses simultaneously to each of the enhanced light detectors of the array, the array being positioned at a focal plane of said super speed video camera.

4. A super speed video camera as defined by claim 3, which further comprises:

digital storage means for storing output electric signals generated by each of the enhanced light detectors of the array; and switching means operatively interposed between and coupled with the array of enhanced light detectors and the digital storage means for transferring the output electric currents generated by the enhanced light detectors of the array to the digital storage means.

5. A communication system, which comprises:

a plurality of pulsed laser sampling light amplifiers, the pulsed laser sampling light amplifiers including a semiconductor laser light amplifier having an input end and an output end and means defining a resonant cavity situated between and coupled to the input end and the output end;

means for generating electric current pulses, the current pulse generating means being coupled to the laser light amplifier to apply electric current pulses to the light amplifier to inject minority carriers into the resonant cavity thereof;

the electric current pulses generated by the pulse generating means being of sufficient magnitude and duration to raise the number of the minority carriers above a critical level temporarily after the application of each of the current pulses, the current pulses being sufficiently separated in time for the minority carriers to decay below the critical level after the termination of each of the current pulses, said critical level of minority carriers being defined as the minimum number of minority carriers above which an intensity of light in the resonant cavity would rise exponentially with time even without further light input;

means for generating a control signal, the control signal generating means being coupled to the current pulse generating means and providing a control signal thereto for controlling the timing of the electric current pulses generated by the pulse generating means, and wherein, each of the laser sampling light amplifiers being provided with an input light signal and generating an output signal; and a controller, the controller being coupled to each of the pulsed laser sampling light amplifiers and providing a control signal thereto.

6. A communication system as defined by claim 5, wherein the control signals are provided to the electric current pulse generating means of the pulsed laser sampling light amplifiers to control the timing of the electric current pulses generated by the pulse generating means.

* * * * *